United States Patent
Chen et al.

(10) Patent No.: US 10,085,356 B2
(45) Date of Patent: Sep. 25, 2018

(54) ELECTRONIC DEVICE WITH LOCKING ASSEMBLY

(71) Applicant: UBTECH Robotics Corp., Shenzhen (CN)

(72) Inventors: Zhiquan Chen, Shenzhen (CN); Youjun Xiong, Shenzhen (CN)

(73) Assignee: UBTECH ROBOTICS CORP., Shenzhen (CN)

( * ) Notice: Subject to any disclaimer, the term of this patent is extended or adjusted under 35 U.S.C. 154(b) by 33 days.

(21) Appl. No.: 15/367,191

(22) Filed: Dec. 2, 2016

(65) Prior Publication Data

US 2018/0049335 A1    Feb. 15, 2018

(30) Foreign Application Priority Data

Aug. 10, 2016   (CN) .................... 2016 2 0866087 U

(51) Int. Cl.
| | |
|---|---|
| *H05K 5/00* | (2006.01) |
| *H05K 5/02* | (2006.01) |
| *E05B 35/00* | (2006.01) |
| *E05B 65/00* | (2006.01) |
| *E05C 3/00* | (2006.01) |
| *E05C 3/04* | (2006.01) |
| *H01M 2/10* | (2006.01) |

(52) U.S. Cl.
CPC .......... *H05K 5/0221* (2013.01); *E05B 35/008* (2013.01); *E05B 65/006* (2013.01); *E05C 3/00* (2013.01); *E05C 3/042* (2013.01); *H01M 2/10* (2013.01); *H01M 2/1005* (2013.01); *H05K 5/0008* (2013.01); *H05K 5/0217* (2013.01)

(58) Field of Classification Search
CPC .. H05K 5/0221; H05K 5/0217; H05K 5/0008; E05B 35/008; E05B 65/006; E05C 3/00
See application file for complete search history.

(56) References Cited

U.S. PATENT DOCUMENTS

| | | | |
|---|---|---|---|
| 8,763,832 B2 * | 7/2014 | Yeh ..................... | H04M 1/0249 220/345.2 |
| 2005/0009588 A1 * | 1/2005 | Qin ..................... | H04B 1/3833 455/575.8 |
| 2015/0245521 A1 * | 8/2015 | Cheng .................. | G06F 1/1613 224/191 |

* cited by examiner

*Primary Examiner* — James Wu
*Assistant Examiner* — Hung Dang

(57) ABSTRACT

An electronic device includes: a support defining a slot, a casing defining a receiving hole, and a locking assembly for detachably connecting the casing to the support. The locking assembly includes a connection member received in the receiving hole and a locking member connected to and rotatable together with the connection member. The locking member is rotatable to a position where the locking member engages the slot, thereby fixing the casing to the support.

10 Claims, 7 Drawing Sheets

ELECTRONIC DEVICE WITH LOCKING ASSEMBLY

CROSS REFERENCE TO RELATED APPLICATIONS

This application claims priority to Chinese Patent Application No. 201620866087.5, filed Aug. 10, 2016, which is hereby incorporated by reference herein as if set forth in its entirety.

BACKGROUND

1. Technical Field

The present disclosure generally relates to electronic devices, and particularly to an electronic device having a locking assembly to detachably connect a casing to a support.

2. Description of Related Art

As technology advances in hardware and software, robots can realize very swift and accurate movement and provide various functions, such as intelligent recognition. Generally, robots include one or more batteries and casings for holding the batteries. The casings are usually held in position by screws. A user needs to use a tool, such as a screw driver, to remove the casings when attempting to exchange batteries, which is inconvenient when no tools are handy.

SUMMARY

An electronic device includes: a support defining a slot, a casing defining a receiving hole, and a locking assembly for detachably connecting the casing to the support. The locking assembly includes a connection member received in the receiving hole and a locking member connected to and rotatable together with the connection member. The locking member is rotatable to a position where the locking member engages the slot, thereby fixing the casing to the support.

Other objects, advantages and novel features of the invention will become more apparent from the following detailed description when taken in conjunction with the accompanying drawings.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Figure 1:
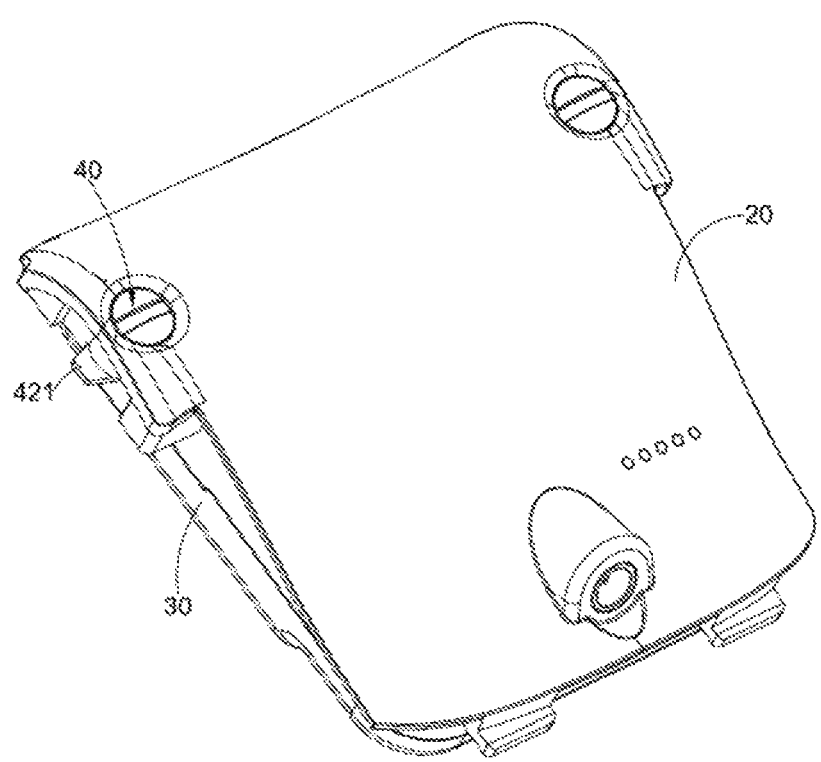
FIG. 1 is an isometric view of an electronic device according to one embodiment.
Figure 2:
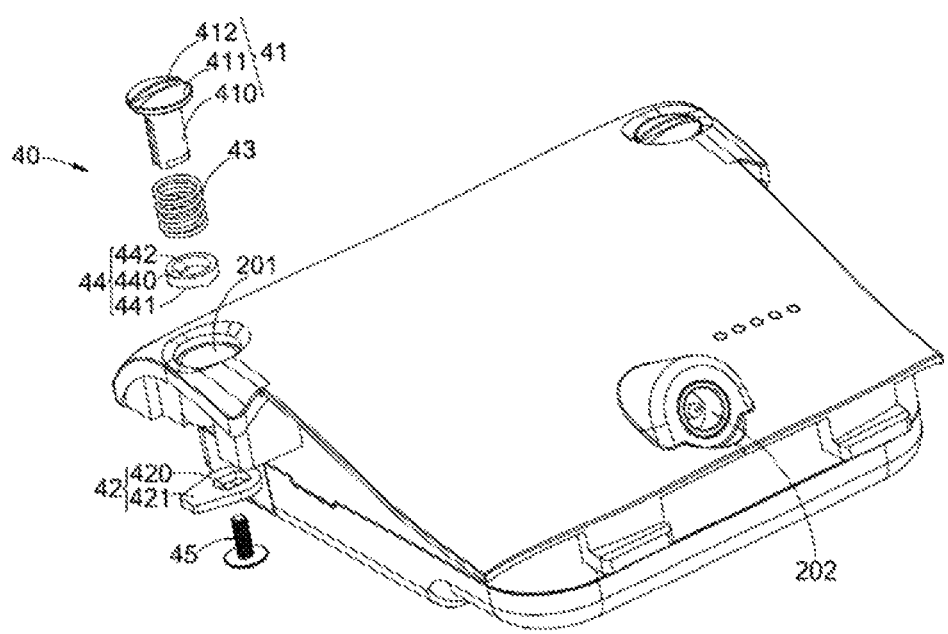
FIG. 2 is an isometric, partially exploded view of the electronic device of FIG. 1 showing a locking assembly.
Figure 3:
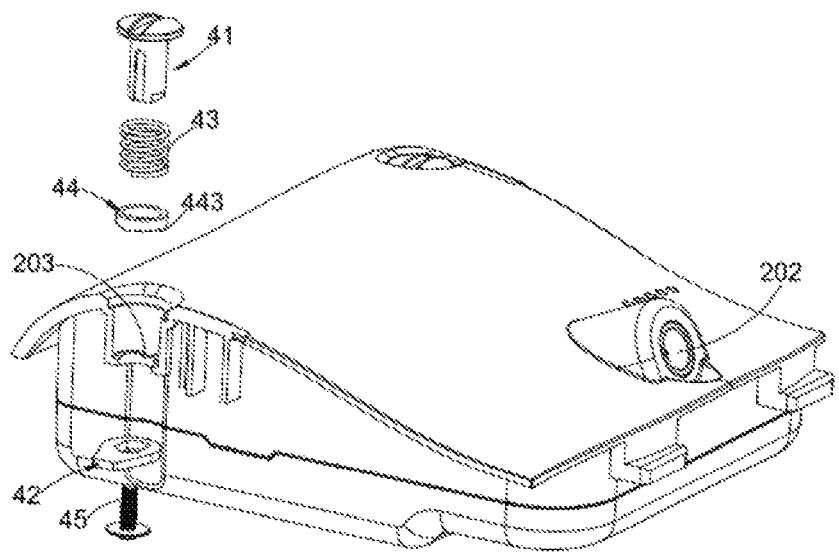
FIG. 3 shows the electronic device of FIG. 2 from another viewpoint with a portion of a casing of the electronic device cut away.

The disclosure is illustrated by way of example and not by way of limitation in the figures of the accompanying drawings, in which like reference numerals indicate similar elements. It should be noted that references to "an" or "one" embodiment in this disclosure are not necessarily to the same embodiment, and such references can mean "at least one" embodiment.

As shown in FIGS. 1-4, an electronic device of one embodiment includes a support 10, a casing 20, a battery 30 fixed to the bottom of the casing 20, and a locking assembly 40 for detachably connecting the casing 20 to the support 10. The casing 20 defines a receiving hole 20l extending from its top surface toward the battery 30. The receiving hole 201 is defined by a cylindrical sidewall and a bottom portion. In the embodiment, the casing 20 and the battery 30 form a battery pack. The casing 20 includes a power port 202 protruding from its top surface. The power port 202 is electrically coupled to the battery 30 and is used to connect the battery 30 to an external power source for charging the battery 30.

The locking assembly 40 includes a connection member 41, a locking member 42 fixed to an end of the connection member 41, a spring 43 arranged around the connection member 41, a connection ring 44 and a screw 45. The connection member 41 includes a main body 410 and a head 411 connected to a top end of the main body 410. The main body 410 is received in the receiving hole 201 of the casing 20. The locking member 42 is fixed to a bottom end of the main body 410. In the embodiment, an elongated slot 412 is defined in the head 411. The slot 412 has a width of about 1-3 mm. It can be understood that the width of the slot 412 may vary according to need. A user can use a tool, such as a screw driver or a coin, to engage the slot 412 and turn the head 411, thereby driving the locking member 42 to rotate together with the connection member 41.

The locking member 42 presses against the external surface of the bottom portion of the receiving hole 201. The bottom portion of the receiving hole 201 defines an aperture that allows the main body 410 to pass therethrough. The locking member 42 is a flat tab 421 that defines a through hole 420. The screw 45 passes through the through hole 420 and is screwed into the bottom end of the main body 410, thereby fixing the locking member 42 to the bottom end of the main body 410.

Figure 5:
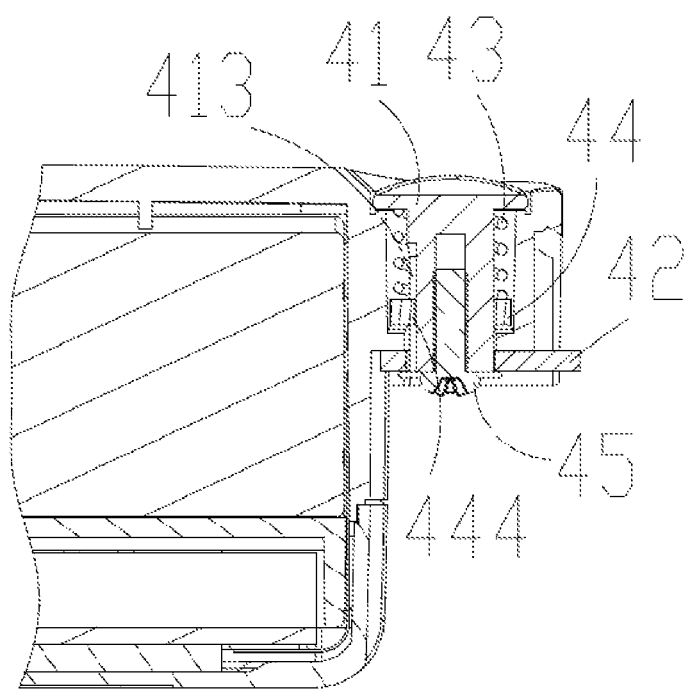
FIG. 5 is a partially sectional view of the electronic device of FIG. 1.

Referring to FIG. 5, the spring 43 is arranged around the main body 410 and includes an upper end abutting against the head 411. The connection ring 44 includes a top end 440 and a bottom end 441 and defines a through hole 442 in its center. The connection ring 44 is connected to the main body 410. In the embodiment, the through hole 442 allows the main body 410 to pass therethrough such that the connection ring 44 is arranged around the main body 410. In the embodiment, the main body 410 defines a groove 413 in a lateral surface along an elongated direction thereof. The connection ring 44 includes a protrusion 444 protruding from the inner lateral surface of the through hole 442. The protrusion 444 is fit in the groove 413, which allows the connection ring 44 to be rotatable together with the main body 410. The lower end of the spring 43 abuts against the top end 440 of the connection ring 44. The through hole 442 has a size the same as the aperture, thereby allowing the screw 45 to pass through the through hole 442 and the aperture to be screwed into the bottom end of the main body 410.

At least one dent 203 is defined in a bottom portion of the receiving hole 201 of the casing 20, and the connection ring 44 includes at least one protrusion 443 protruding from the bottom end 441. In the embodiment there are four protrusions 443 and four dents 302. The four protrusions 443 are evenly arranged on the connection ring 44, and the four dents 203 are evenly arranged in the bottom portion of the receiving hole 201. The connection ring 44 is rotatable to a first position where the protrusions 443 are respectively received in the dents 203, thereby holding the connection ring 44 in position. As a result, the locking assembly 40 will not rotate without an external force applied thereon, and thus maintain an engagement between the locking assembly 40 and the support 10, thereby fixing the casing 20 to the support 10. When attempting to detach the casing 20 from the support, a user needs to rotate the connection member 41 to disengage, the locking assembly 40 from the support 10. It can be understood that the numbers of the protrusions 443 and the dents can vary according to need.

Figure 4:
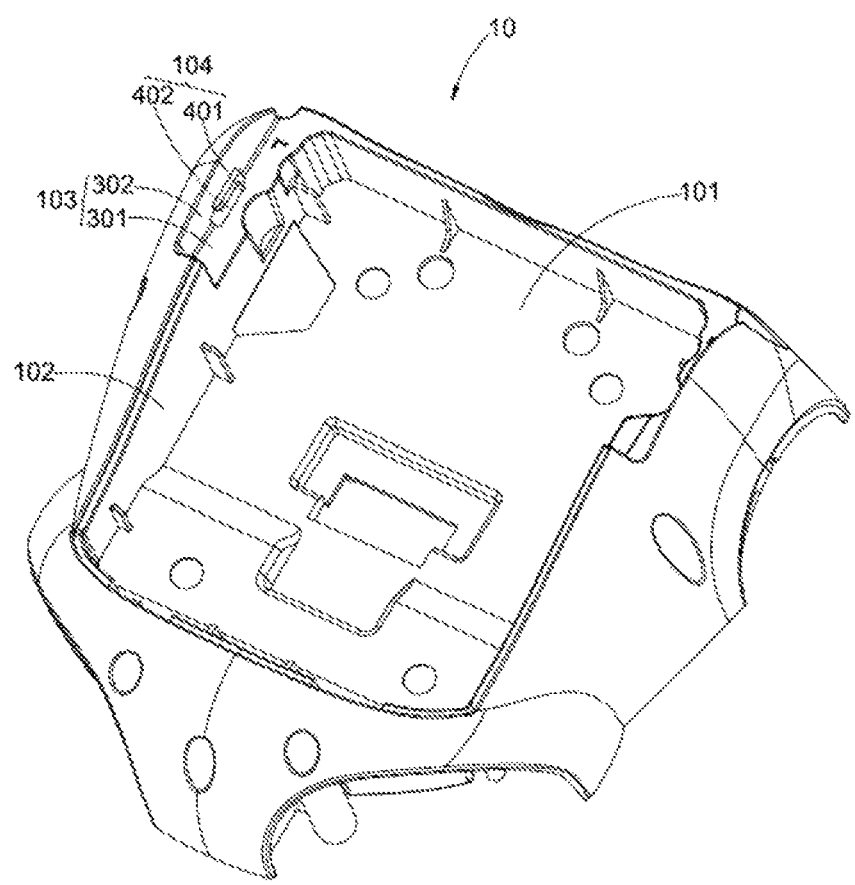
FIG. 4 is an isometric view of a support according to one embodiment.

As shown in FIG. 4, the support 10 defines a receiving space 101 and includes a connection surface 103 extending from a top of a sidewall 102 of the receiving space 101. The battery 30 and a portion of the casing 20 connected with the battery 30 are received in the receiving space 101.

The connection surface 103 includes a first, horizontal surface 301 joining the sidewall 102, and a second, vertical surface 302 joining the first surface 301. A slot 104 is defined in an area where the first surface 301 and the second surface 302 join. The slot 104 includes a first recessed portion 401 defined in the first surface 301 and a second recessed portion 402 defined in the second surface 302, and an end of the locking member 42 is received in the second recessed portion 402 when the casing 20 is fixed to the support 10. In the embodiment, the second recessed portion is L shaped.

Figure 6:
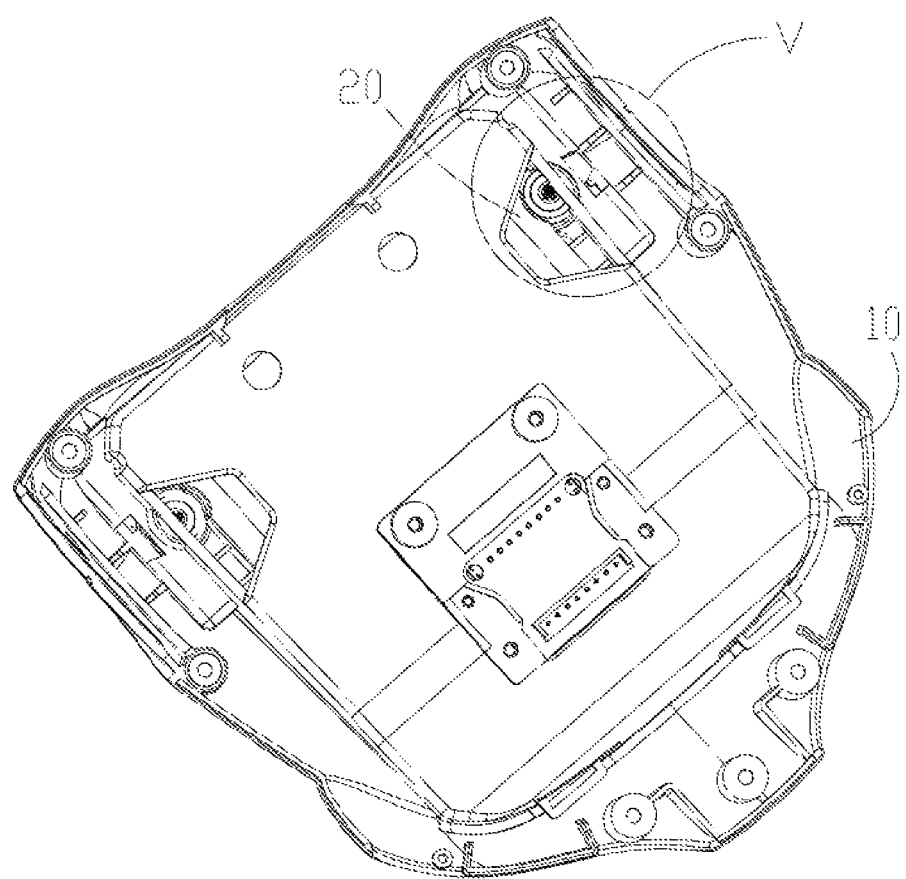
FIG. 6 is planar view of electronic device of FIG. 1, viewed from the bottom of the electronic device.
Figure 7:
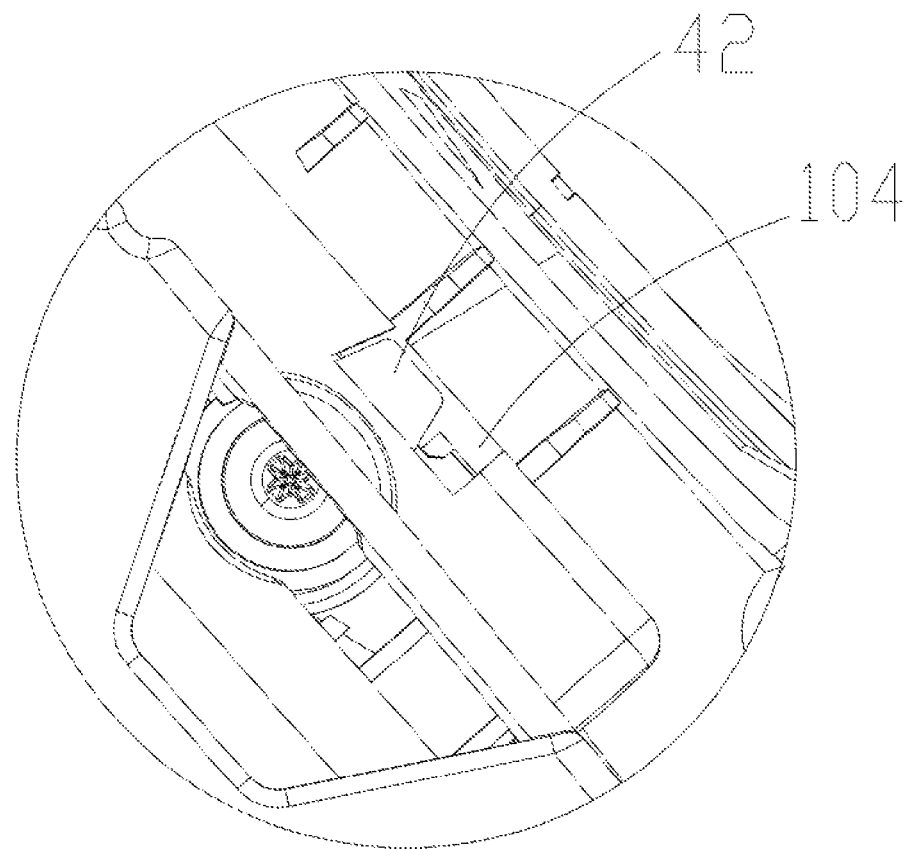
FIG. 7 is an enlarged view of a portion V of FIG. 6.

Referring to FIGS. 6 and 7, the locking member 42 is rotatable to a first position where the locking member 42 engages the slot 104, thereby connecting the casing 20 to the support 10. The locking member 42 is rotatable to a second position where the locking member 42 is disengaged from the slot 104. In the embodiment, the length of the second recessed portion 402 is less than the length of the first recessed portion 401. The width of the locking member 42 decreases gradually from one end to the end that received in the second recessed portion 402.

When attempting to connect the casing 20 to the support 10, a user need to turn the connection member 41 so as to rotate the locking member 42 until the end of the locking member 42 moves into the slot 104. After the protrusions 443 of the connection ring 44 move into the dents 203 of the casing 20, the connection ring 44 is thus held in position. As a result, the locking member 42 maintains the engagement with the slot 104.

When attempting to detach the casing 20 from the support 10, a user need to turn the connection member 42 in a reverse direction so as to rotate the locking member 42 until the end of the locking member 42 moves out of the slot 104.

The casing 20 can be easily connected to or detached from the support 10 by turning the head 41 of the connection member 41, which is convenient.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. An electronic device comprising:
    a support defining a slot;
    a casing defining a receiving hole, at least one dent being defined in a bottom of the receiving hole;
    a locking assembly configured to detachably connect the casing to the support, the locking assembly comprising a connection member received in the receiving hole and a locking member connected to and rotatable together with the connection member, the locking member being rotatable to a position where the locking member engages the slot, thereby fixing the casing to the support; and
    a connection ring that is connected to and rotatable together with the connection member, the connection ring comprises at least one protrusion, the at least one protrusion is configured to be received in the at least one dent so as to enable the locking member to maintain the engagement with the slot;
    wherein the connection member comprises a main body received in the receiving hole and a head connected to a first end of the main body, and the locking member is connected to a second end of the main body that is opposite to the first end;
    wherein the locking member defiles a through hole and is connected to the connection member by a screw passing through the through hole.

2. The electronic device of claim 1, wherein the support defines a receiving space and comprises a connection surface extending from a top of a sidewall of the receiving space, the slot is defined in the connection surface, and at least a portion of the casing is received the receiving space.

3. The electronic device of claim 2, wherein the connection surface comprises a first surface that joins the sidewall of the receiving space, and a second surface that joins the first surface, the slot includes a first recessed portion defined in the first surface and a second recessed portion defined in the second surface, and an end of the locking member is received in the second recessed portion when the casing is fixed to the support.

4. The electronic device of claim 3, wherein a length of the second recessed portion is less than a length of the first recessed portion, and a width of the locking member decreases gradually from one end to the end that received in the second recessed portion.

5. The electronic device of claim 1, wherein the locking member is rotatable to a position where the locking member is disengaged from the slot, thereby allowing the casing to be detached from the support.

6. The electronic device of claim 1, wherein the locking assembly further comprises a spring, the spring is arranged around the main body of the connection member, and comprises an upper end abutting against the head of the connection member and a lower end that is opposite to the upper end and abuts against the connection ring.

7. The electronic device of claim 6, wherein the connection ring comprises a top end and a bottom end and defines a through hole, and the lower end of the spring abuts against the top end of the connection ring.

8. The electronic device of claim 7, wherein the at least one protrusion protrudes from the bottom end, the connection ring is rotatable to a first position where the at least one protrusion is received in the at least one dent, and to a second position where the at least one protrusion is disengaged from the at least one dent.

9. An electronic device comprising:
   a support defining a slot;
   a casing defining a receiving hole; and
   a locking assembly configured to detachably connect the casing to the support, the locking assembly comprising a connection member received in the receiving bole and a locking member connected to and rotatable together with the connection member, the locking member being rotatable to a position where the locking member engages the slot, thereby fixing the casing to the support;
   wherein the connection member comprises a main body received in the receiving hole and a head connected to a first end of the main body, and the locking member is connected to a second end of the main body that is opposite to the first end;
   wherein the locking member defines a through hole and is connected to the connection member by a screw passing through the through hole.

10. An electronic device comprising:
    a support defining a slot;
    a casing defining a receiving hole; and
    a locking assembly configured to detachably connect the casing to the support, the locking assembly comprising a connection member received in the receiving hole and a locking member connected to and rotatable together with the connection member, the locking member being rotatable to a position where the locking member engages the slot, thereby fixing the casing to the support;
    wherein the support defines a receiving space and comprises a connection surface extending from a top of a sidewall of the receiving space, the slot is defined in the connection surface, and at least a portion of the casing is received in the receiving space;
    wherein the connection surface comprises a first surface that joins the sidewall of the receiving space, and a second surface that joins the first surface, the slot includes a first recessed portion defined in the first surface and a second recessed portion defined in the second surface, and an end of the locking member is received in the second recessed portion when the casing is fixed to the support.

* * * * *